(12) United States Patent
Fujii

(10) Patent No.: US 7,078,856 B2
(45) Date of Patent: Jul. 18, 2006

(54) WAVELENGTH VARIABLE LIGHT SOURCE

(75) Inventor: Hiroyuki Fujii, Kyoto (JP)

(73) Assignee: Sanyo Electric Co., Ltd., Osaka (JP)

( * ) Notice: Subject to any disclaimer, the term of this patent is extended or adjusted under 35 U.S.C. 154(b) by 51 days.

(21) Appl. No.: 10/395,847

(22) Filed: Mar. 25, 2003

(65) Prior Publication Data

US 2003/0231370 A1   Dec. 18, 2003

(30) Foreign Application Priority Data

Mar. 26, 2002   (JP)   ............................ 2002-086529

(51) Int. Cl.
*H05B 33/22*   (2006.01)

(52) U.S. Cl. ...................... 313/508; 313/506; 313/110; 359/579; 385/131

(58) Field of Classification Search ........ 313/498–512; 428/690, 917; 385/129–132
See application file for complete search history.

(56) References Cited

U.S. PATENT DOCUMENTS

| | | | | |
|---|---|---|---|---|
| 2,816,236 A | * | 12/1957 | Rosen | .................. 250/214 LA |
| 3,290,549 A | * | 12/1966 | Lambe et al. | .................. 315/55 |
| 5,405,710 A | * | 4/1995 | Dodabalapur et al. | ...... 428/690 |
| 5,493,426 A | * | 2/1996 | Johnson et al. | ................ 349/74 |
| 5,969,475 A | * | 10/1999 | Friend et al. | ................ 313/506 |
| 6,046,547 A | * | 4/2000 | Nishio et al. | ............ 315/169.3 |
| 6,091,197 A | * | 7/2000 | Sun et al. | .................... 313/509 |
| 6,404,127 B1 | * | 6/2002 | Jacobsen et al. | ............ 313/506 |

FOREIGN PATENT DOCUMENTS

| | | | |
|---|---|---|---|
| JP | 08-315983 | | 11/1996 |
| JP | 10160859 A | * | 6/1998 |
| JP | 2000243560 A | * | 9/2000 |

* cited by examiner

*Primary Examiner*—Nimeshkumar D. Patel
*Assistant Examiner*—German Colón
(74) *Attorney, Agent, or Firm*—Arent Fox PLLC

(57) ABSTRACT

A wavelength variable light source is provided with: a light emitting layer containing therein light emitting substance having a carbon-carbon inter-atomic bond; a pair of electrodes disposed on both sides of the light emitting layer while holding the light emitting layer therebetween; a pair of main reflectors disposed on both sides of the light emitting layer so as to hold the light emitting layer therebetween, thereby to constitute an optical resonator with respect to light emitted from the light emitting layer; and refractive index modulating means disposed on the optical path of the optical resonator, wherein the refractive index modulating means can reversibly vary the length of the optical path of the optical resonator so as to control the wavelength of the light emitted from the light source.

32 Claims, 2 Drawing Sheets

WAVELENGTH VARIABLE LIGHT SOURCE

BACKGROUND OF THE INVENTION

1. Field of the Invention

The present invention relates to a light source capable of varying a light emitting wavelength in a light source including an organic electroluminescence (organic EL) element or the like.

2. Related Art

An organic EL element using an amorphous thin film made of organic substance has been actively developed in recent years. In a light source for allowing the organic substance of the organic EL element or the like to emit light, it has been difficult to modulate a light emitting wavelength because the width of a light emitting spectrum has been great. For example, in a light source disclosed in Japanese Patent Publication Laid-open No. 08-315983, a light emitting layer includes an organic light emitting material having a light emitting peak wavelength ranging from 450 nm to 570 nm and a half-value breadth ranging from 100 nm to 200 nm.

Consequently, it has been difficult to use the light source for allowing the organic substance of the organic EL element or the like to emit the light as a light source for performing optical communications at a high speed by a frequency modulating system. Furthermore, since a response speed during the flickering of the light source has ranged from several micro seconds to several hundred micro seconds, it has been difficult to perform the optical communications at the high speed even by a pulse width modulation system or a pulse code modulation system.

SUMMARY OF THE INVENTION

A first object of the present invention is to provide a wavelength variable light source which has a narrow width of a light emitting spectrum and can readily vary a light emitting wavelength in the light source for allowing organic substance of an organic EL element or the like to emit light.

A second object of the present invention is to provide a wavelength variable light source which can widen an angle of view and limit the same for protection of an privacy.

The wavelength variable light source according to the present invention comprises: a light emitting layer containing therein light emitting substance having a carbon-carbon inter-atomic bond; a pair of electrodes disposed on both sides of the light emitting layer while holding the light emitting layer therebetween; a pair of main reflectors disposed on both sides of the light emitting layer while holding the light emitting layer therebetween, so as to constitute an optical resonator with respect to light emitted from the light emitting layer; and refractive index modulating means disposed on the optical path of the optical resonator, wherein the refractive index modulating means can reversibly vary the length of the optical path of the optical resonator so as to control the wavelength and/or directivity of the light emitted from the light source.

Examples of the refractive index modulating means according to the present invention include means consisting of a piezoelectric member held between the pair of electrodes. With the application of a voltage to the piezoelectric member by the pair of electrodes, the thickness of the piezoelectric member is varied by a piezoelectric effect, so that its refractive index can be varied. The above-described piezoelectric member is provided on the optical path of the optical resonator, thereby varying the length of the optical path of the optical resonator, so as to control the variations of the length of the wavelength of the light emitted from the light source.

Either one of the pair of electrodes holding the piezoelectric member therebetween may be constituted of either one of the pair of electrodes holding the light emitting layer therebetween.

Besides the above-described piezoelectric member, means having a refractive index which is varied according to a stimulus such as a voltage, a current, an electromagnetic wave, an elastic wave or heat can be used as the refractive index modulating means according to the present invention. Specifically, there can be used substance exhibiting an electrooptic effect, an acoustooptic effect, a magnetooptic effect, a thermooptic effect or a nonlinear optical effect.

According to the present invention, the pair of main reflectors may be constituted of the pair of electrodes holding the light emitting layer therebetween. That is to say, in the case where the electrode is formed of a metallic thin film, this metallic thin film can be used as the main reflector.

Since the pair of main reflectors constitute the optical resonator according to the present invention, it is preferable that the length of the optical path between the pair of main reflectors should be substantially equal to a multiple of a natural number of a half of a predetermined peak wavelength (i.e., a designed peak wavelength) of the light emitted from the light source. Specifically, for example, it is preferable that the length of the optical path between the pair of main reflectors should range from 99/200 to 101/200 of a multiple of a natural number of a predetermined peak wavelength of the light emitted from the light source.

According to the present invention, it is preferable that the length of the optical path from the center of a region in the light emitting layer, in which the light emission occurs most strongly, to the main reflector should be substantially equal to a multiple of a natural number of a half of a predetermined peak wavelength of the light emitted from the light source. Specifically, for example, it is preferable that the length of the optical path from the center of a region in the light emitting layer, in which the light emission occurs most strongly, to the main reflector should range from 99/200 to 101/200 of a multiple of a natural number of a predetermined peak wavelength of the light emitted from the light source. With this setting, it is possible to further enhance a wavelength selecting effect.

The region in the light emitting layer, in which the light emission occurs most strongly, may be located in the vicinity of the end face of the light emitting layer or at the center of the light emitting layer. Otherwise, it may be located inside of the layer adjacent to the light emitting layer. Therefore, it is preferable that the length of the optical path between the end face of the light emitting layer and the main reflector should be set as follows:

Namely, it is preferable that the length of the optical path from an end face nearer a region in the light emitting layer, in which the light emission occurs most strongly, to the main reflector nearer the end face should be substantially equal to or slightly smaller than a multiple of a natural number of a half of a predetermined peak wavelength of the light emitted from the light source. Specifically, for example, it is preferable that the length of the optical path from an end face nearer a region in the light emitting layer, in which the light emission occurs most strongly, to the main reflector nearer the end face should range from 101/200 to 88/200 of a multiple of a natural number of a predetermined peak wavelength of the light emitted from the light source.

It is preferable that the length of the optical path from an end face nearer a region in the light emitting layer, in which the light emission occurs most strongly, to the main reflector more remote from the end face should be substantially equal to or slightly greater than a multiple of a natural number of a half of a predetermined peak wavelength of the light emitted from the light source. Specifically, for example, it is preferable that the length of the optical path from an end face nearer a region in the light emitting layer, in which the light emission occurs most strongly, to the main reflector more remote from the end face should range from 99/200 to 112/200 of a multiple of a natural number of a predetermined peak wavelength of the light emitted from the light source.

According to the present invention, an auxiliary electrode having light transmittance may be disposed outside of at least either one of the pair of electrodes holding the light emitting layer therebetween. Such an auxiliary electrode is disposed in such a manner as to be brought into contact with the electrode made of the metallic thin film, thereby constituting a composite electrode consisting of the electrode made of the metallic thin film and the auxiliary electrode. With the auxiliary electrode having the light transmittance, the thickness of the electrode made of the metallic thin film can be reduced, thereby achieving both characteristics of conductivity and light transmittance. Consequently, the light can be emitted on the side on which the above-described auxiliary electrode is disposed.

It is preferable that the length of the optical path of the auxiliary electrode should be substantially equal to a multiple of a natural number of a half of a predetermined peak wavelength of the light emitted from the light source. Specifically, for example, it is preferable that the length of the optical path of the auxiliary electrode should range from 99/200 to 101/200 of a multiple of a natural number of a predetermined peak wavelength of the light emitted from the light source.

Although the light emitting layer according to the present invention is, for example, an organic EL light emitting layer containing therein organic EL light emitting substance, the present invention is not limited to this.

DESCRIPTION OF THE PREFERRED EMBODIMENTS

EXAMPLE 1

Figure 1:
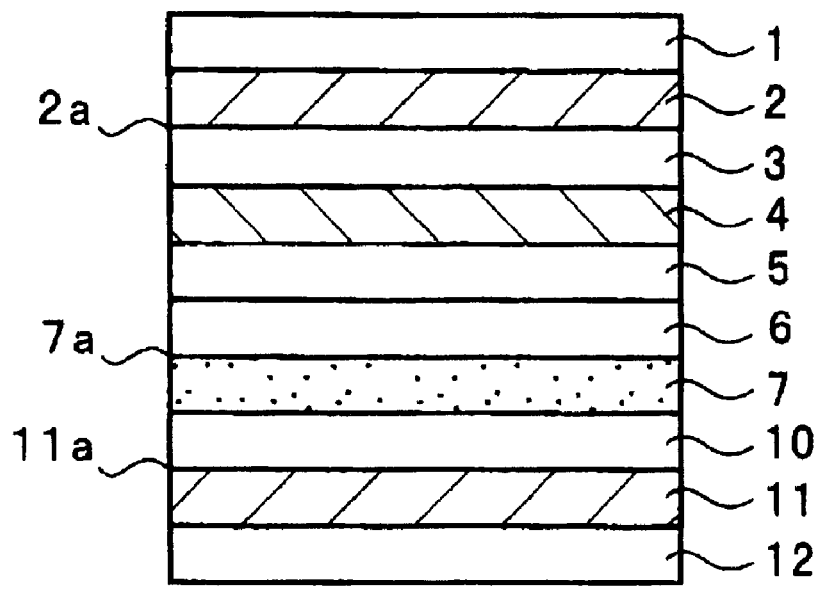
FIG. 1 is a schematic cross-sectional view showing a wavelength variable light source in a preferred embodiment according to the present invention.

FIG. 1 is a schematic cross-sectional view showing a wavelength variable light source in a preferred embodiment according to the present invention. A thin film (having a thickness of 200 nm) made of gold serving as a first electrode 2 is formed on a substrate 1 made of glass by sputtering method. On the first electrode 2, a piezoelectric thin film 3 (having a thickness of 50 nm) having light transmittance is formed as refractive index modulating means by reactive sputtering method with an electron cyclotron resonance (abbreviated as "ECR") plasma in an atmosphere of argon and nitrogen. The piezoelectric thin film 3 is made of aluminum nitride (AlN). On the piezoelectric thin film 3, a transparent conductive thin film made of $In_2O_3$—$_{SnO2}$ (ITO) (having a thickness of 50 nm) is formed as a second electrode 4 by sputtering method.

On the second electrode 4, a hole injecting layer 5 (having a thickness of 9 nm) made of copper phthalocyanine (CuPc) expressed by the following chemical formula is formed:

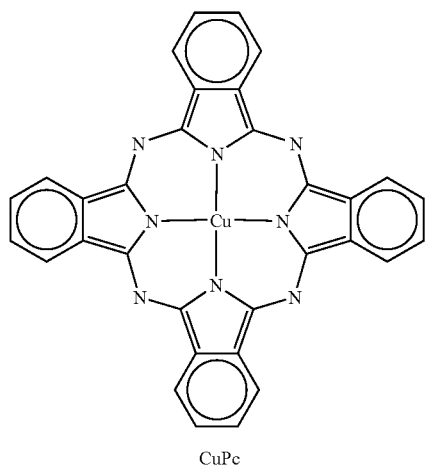

CuPc

On the hole injecting layer 5, a hole transporting layer 6 (having a thickness of 30 nm) made of 4,4'-bis[N-(1-napthyl)-N-phenyl-amino]biphenyl (NPB) expressed by the following chemical formula is formed:

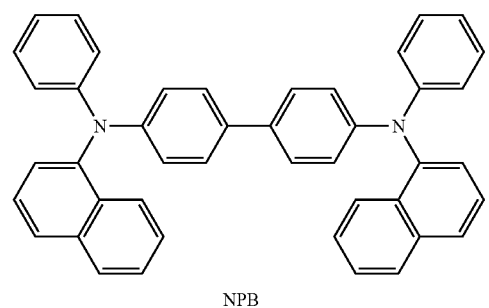

NPB

On the hole transporting layer 6, a light emitting layer 7 (having a thickness of 150 nm) made of aluminumtris(8-hydroxyquinoline) (Alq) expressed by the following chemical formula is formed:

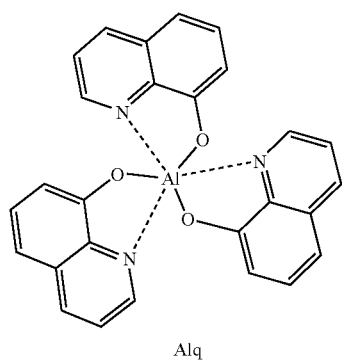

Alq

On the light emitting layer 7, an electron injecting layer 10 (having a thickness of 1 nm) made of lithium fluoride (LiF) is formed. On the electron injecting layer 10, a layer (having a thickness of 10 nm) as a third electrode 11 which has light semi-transmittance and is made of an magnesium alloy (Mg:In) containing 20% by mass of indium is formed. On the third electrode 11, an ITO thin film (having a thickness of 136 nm) is formed by a sputtering method as an auxiliary electrode 12 having light transmittance. The third electrode 11 and the auxiliary electrode 12 constitute a composite electrode.

Each of the hole injecting layer 5, the hole transporting layer 6, the light emitting layer 7, the electron injecting layer 10, and the third electrode 11 are formed by a vacuum evaporation method.

Here, the simplified molecular formula of CuPc is expressed by $C_{32}H_{16}N_8Cu$, which has a mol mass of 576.08 g/mol. The simplified molecular formula of NPB is expressed by $C_{44}H_{32}N_2$, which has a mol mass of 588.75 g/mol, a melting point of 277° C., a glass transition temperature of 96° C., an ionization potential of 5.4 eV and an energy gap between HOMO and LUMO of 3.1 eV. The simplified molecular formula of Alq is expressed by $C_{27}H_{18}N_3O_3Al$, which has a mol mass of 459.4318 g/mol, a thermal decomposition temperature of 412° C., a glass transition temperature of 175° C., an ionization potential of 5.7 eV and an energy gap between HOMO and LUMO of 2.7 eV without any melting point.

Table 1 shows below the material, refractive index, actual thickness and optical thickness of each of the above-described layers.

layer 7 while holding the light emitting layer 7 therebetween, and further, they constitute main reflectors, respectively. These main reflectors further constitute a Fabry-Pérot type optical resonator. Moreover, with the application of a voltage to the piezoelectric thin film 3 from the first electrode 2 and the second electrode 4, the thickness of the piezoelectric thin film 3 can be varied, and further, the refractive index of the piezoelectric thin film 3 can be varied. Consequently, the length of the optical path of the optical resonator constituted of the first electrode 2 and the third electrode 11 can be varied by varying the refractive index of the piezoelectric thin film 3. Thus, the wavelength peak of the light emitted from the optical resonator can be varied by varying the length of the optical path of the optical resonator.

Table 2 shows the lengths of the optical paths between the main reflectors in the present example: namely, the length of the optical path between the end face 2a of the first electrode and the end face 11a of the third electrode, the length of the optical path between the end face 2a of the first electrode and the end face 7a of the light emitting layer, the length of the optical path between the end face 2a of the first electrode and the center of a region in the light emitting layer, in which light emission occurs most strongly (hereinafter referred to as "a light emitting region"), the length of the optical path between the end face 7a of the light emitting layer and the end face 11a of the third electrode, and the length of the optical path between the light emitting region and the end face 11a of the third electrode; and the length of the optical path within the auxiliary electrode 12. Incidentally, in the present specification, a designed peak wavelength signifies

TABLE 1

| Ref. No. | | Material | Refractive Index | Actual Thickness (nm) | Optical Thickness (nm) | |
|---|---|---|---|---|---|---|
| 1 | Substrate | Glass | | | | |
| 2 | First Electrode | Au | — | 200 | — | ← 2a |
| 3 | Piezoelectric Thin Film | AlN | 1.9 | 50 | 95.0 | |
| 4 | Second Electrode | ITO | 1.93 | 50 | 96.5 | |
| 5 | Hole Injecting Layer | CuPc | 1.76 | 9 | 15.8 | |
| 6 | Hole Transporting Layer | NPB | 1.76 | 30 | 52.8 | |
| 7 | Light Emitting Layer | Alq | 1.76 | 150 | 264.0 | ← 7a |
| 10 | Electron Injecting Layer | LiF | 1.39 | 1 | 1.4 | |
| 11 | Third Electrode | Mg:In | — | 10 | — | ← 11a |
| 12 | Auxiliary Electrode | ITO | 1.93 | 136 | 262.5 | |

In Table 1, reference number 2a designates the position of the end face of the first electrode 2; 7a, the position of the end face of the light emitting layer 7; and 11a, the position of the end face of the third electrode 11.

In the present example, the first electrode 2 and the third electrode 11 are disposed on both sides of the light emitting a light emitting peak wavelength from the light source in the case where no voltage is applied to the piezoelectric thin film 3. Moreover, in the present example, the light emitting region in the light emitting layer is located at a position inward by 2.7 nm of the optical thickness from the end face 7a of the light emitting layer.

TABLE 2

Example 1
Light Emitting Region: Inward by 2.7 nm from End
Face 7a of Light Emitting Layer
Designed Peak Wavelength: 525 nm

|  | Length of the Optical Path (nm) | Length of the Optical Path/ Designed Peak Wavelength |
|---|---|---|
| From the End Face 2a of the 1st Electrode to the End Face 11a of the 3rd Electrode | 525.5 | 200/200 |
| From the End Face 2a of the 1st Electrode to the End Face 7a of the Light Emitting Layer | 260.1 | 99/200 |
| From the End Face 2a of the 1st Electrode to the Light Emitting Region | 262.8 | 100/200 |
| From the End Face 7a of the Light Emitting Layer to the End Face 11a of the 3rd Electrode | 265.4 | 101/200 |
| From the Light Emitting Region to the End Face 11a of the 3rd Electrode | 262.7 | 100/200 |
| Within the Auxiliary Electrode 12 | 262.5 | 100/200 |

The lengths of the optical paths shown in Table 2 are values obtained by summing the optical thicknesses of the predetermined layers shown in Table 1, respectively. Here, the length of the optical path having the light emitting region at one end is obtained in consideration of 2.7 nm of the optical thickness since the light emitting region is located by 2.7 nm of the optical thickness inward of the end face 7a of the light emitting layer. In addition, the end face of the light emitting layer near the light emitting region is the end face 7a, so that the length of the optical path having the end face 7a at one end is obtained.

As shown in Table 2, the length of the optical path between the main reflectors (that is, the length of the optical path from the end face 2a of the first electrode to the end face 11a of the third electrode) is substantially equal to a multiple of a natural number of a half of the designed peak wavelength. Therefore, the phase of the light of the designed peak wavelength matches with that of the optical resonator, thereby strengthening the interference of the optical wave, such that the light emission having the matched designed peak wavelength is selectively strengthened. Thus, the shape of the light emitting peak of the light to be emitted from the light source is sharpened, thereby reducing the full width at half maximum (hereinafter referred to as "the half-value breadth").

Moreover, the lengths of the optical paths between the light emitting region and the main reflectors (that is, the length of the optical path from the end face 2a of the first electrode to the light emitting region and the length of the optical path from the light emitting region to the end face 11a of the third electrode) also are substantially equal to a multiple of a natural number of a half of the designed peak wavelength. Therefore, the phase of the light of the designed peak wavelength matches with that of the optical resonator, so that the light emission having the matched designed peak wavelength is more selectively strengthened.

Additionally, the length of the optical path from the end face 2a of the first electrode to the end face 7a of the light emitting layer ranges from 101/200 to 88/200 of a multiple of a natural number of the designed peak wavelength. In addition, the length of the optical path from the end face 7a of the light emitting layer to the end face 11a of the third electrode ranges from 99/200 to 112/200 of a multiple of a natural number of the designed peak wavelength.

The length of the optical path within the auxiliary electrode 12 is substantially equal to a multiple of a natural number of a half of the designed peak wavelength. Therefore, the phase of the light of the designed peak wavelength matches with that of the optical resonator, so that the light emission having the matched designed peak wavelength is more selectively strengthened.

The first electrode and the second electrode in the light source in the present example were electrically short-circuited to set a control voltage Vc to zero, and a current was supplied with the application of a DC voltage of 14 V between the second electrode and the third electrode. In the case of the observation on the front axis of a light emitting face parallel to the normal of the light emitting face (that is, an observation angle θ was 0), the emission of green light having a light emitting peak wavelength of 525 nm and a half-value breadth of a light emitting peak of 40 nm was observed. Even in the case where the voltage to be applied between the second electrode and the third electrode was varied, no variation of the light emitting peak wavelength was observed. In the case of the observation in a direction inclined by the angle θ from the normal of the light emitting face, the emission of green light having a light emitting peak wavelength of 493 nm and a half-value breadth of a light emitting peak of 30 nm was observed when the angle θ was 20°. Furthermore, the emission of weak blue-green light having a light emitting peak wavelength of about 450 nm was observed when the angle θ was 30°. Moreover, the light emission was hardly observed when the angle θ was 35° or more.

Subsequently, while an AC voltage of 200 V as the control voltage was applied to the first electrode and the second electrode, the current was supplied with the application of a DC voltage of 14 V between the second electrode and the third electrode. In the case of the observation on the front axis of the light emitting face parallel to the normal of the light emitting face (that is, the observation angle θ was 0), the emission of green light having the light emitting peak wavelength shifted to 521 nm and a half-value breadth of a light emitting peak of 40 nm was observed. In the case of the observation in a direction inclined by the angle θ from the normal of the light emitting face, the emission of green light having a light emitting peak wavelength of 489 nm and a half-value breadth of a light emitting peak of 25 nm was observed when the angle θ was 20 . Furthermore, the emission of very weak blue-green light having a light emitting peak wavelength of about 450 nm was observed when the angle θ was 30°. Moreover, no light emission was observed at all when the angle θ was 35° or more.

Next, while a DC voltage of 200 V was applied between the first electrode and the second electrode, the current was supplied with the application of a DC voltage of 14 V between the second electrode and the third electrode. In the case of the observation on the front axis of the light emitting face parallel to the normal of the light emitting face (that is, the observation angle θ was 0), the shift of the light emitting peak wavelength to 515 nm was observed. In the case of the observation in a direction inclined by the angle θ from the normal of the light emitting face, the emission of green light having a light emitting peak wavelength of 484 nm and a half-value breadth of a light emitting peak of 20 nm was observed when the angle θ was 20°. The light emission was hardly observed when the angle θ was 30° or more.

COMPARATIVE EXAMPLE 1

Neither the first electrode 2 and nor the piezoelectric thin film 3 in Example 1 were formed, and a second electrode 4 was formed directly on a substrate 1. On the second electrode 4, layers were formed in the same manner as in Example 1, thus fabricating a light source for comparison. The constitution and thickness of each of the layers were the same as those in Example 1.

A current was supplied with the application of a DC voltage of 14 V between the second electrode and a third electrode in the light source for comparison. In the case of the observation on the front axis of a light source parallel to the normal of a light emitting face, the emission of green light having a light emitting peak wavelength of 533 nm and a half-value breadth of a light emitting peak of 80 nm was observed. The light emitting intensity was as low as less than 40% in comparison with that in Example 1. Even in the case where the voltage to be applied between the second electrode and the third electrode was varied, no variation of the light emitting peak wavelength was observed. In the case of the observation in a direction inclined by the angle θ from the normal of the light emitting face, no variation of the light emitting peak wavelength was observed when the angle θ ranged from 0° to 75°. Although it was difficult to measure a light emitting spectrum when the angle θ exceeded 75°, no variation of the emitted light color was observed even as viewed almost sideways.

EXAMPLE 2

Figure 2:
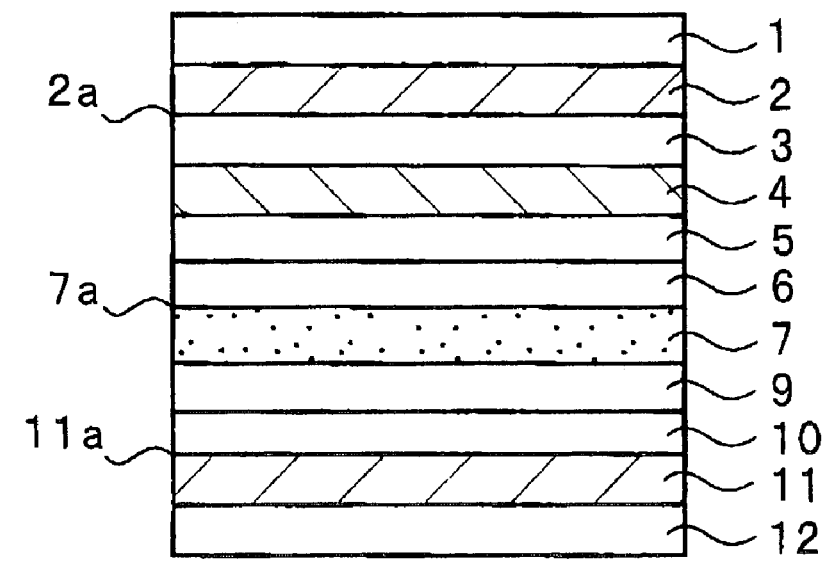
FIG. 2 is a schematic cross-sectional view showing a wavelength variable light source in another preferred embodiment according to the present invention.

FIG. 2 is a schematic cross-sectional view showing a wavelength variable light source in another preferred embodiment. A thin film (having a thickness of 50 nm) made of gold serving as a first electrode 2 was formed on a (110) surface of a sapphire substrate serving as a substrate 1 by sputtering method. Subsequently, on the first electrode 2 was formed a thin film (having a thickness of 74 nm) as a piezoelectric thin film 3 made of zinc oxide (ZnO) by reactive sputtering method with an electron cyclotron resonance (abbreviated as "ECR") plasma in an atmosphere of argon and oxygen. On the piezoelectric thin film 3, an ITO thin film (having a thickness of 50 nm) was formed serving as a second electrode 4 by sputtering method.

On the second electrode 4, the same hole injecting layer 5 and the same hole transporting layer 6, as those in Example 1, were formed.

On the hole transporting layer 6, a mixture light emitting layer (having a thickness of 35 nm) was formed by a vacuum evaporation method, as a light emitting layer 7 containing 92.5% by mass of Alq, 5% by mass of 5,6,11,12-tetraphenylnaphthacene (Rubrene) expressed below by a chemical formula and 2.5% by mass of 2-methyl-6-[2-(2,3,6,7-tetrahydro-1H,5H-benzo[ij]quinolizin-9-yl)ethenyl]-4H-pyran-4-ylidene]propane-dinitrile (DCM2) expressed by the following chemical formula.

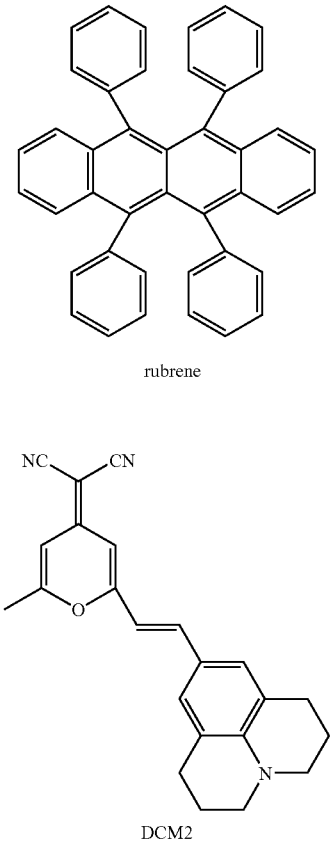

The simplified molecular formula of Rubrene is expressed by $C_{42}H_{28}$, which has a mol mass of 532.68 g/mol. The simplified molecular formula of DCM2 is expressed by $C_{23}H_{21}ON_3$, which has a mol mass of 355.43 g/mol.

On the light emitting layer 7, a layer (having a thickness of 142 nm) was formed as an electron transporting layer 9 made of pure substance of Alq. On the electron transporting layer 9, a layer (having a thickness of 6 nm) was formed as an electron injecting layer 10 made of lithium oxide ($Li_2O$) Both of the above-described layers were formed by a vacuum evaporation method.

On the electron injecting layer 10, a silver layer (having a thickness of 10 nm) was formed as a third electrode 11; and further, on the third electrode 11, an ITO layer (having a thickness of 168 nm) was formed as an auxiliary electrode 12.

Table 3 shows below the material, refractive index, actual thickness and optical thickness of each of the layers.

TABLE 3

| Ref. No. | | Material | Refractive Index | Actual Thickness (nm) | Optical Thickness (nm) | |
|---|---|---|---|---|---|---|
| 1 | Substrate | Sapphire | | | | |
| 2 | First Electrode | Au | — | 50 | — | ←2a |
| 3 | Piezoelectric Thin Film | ZnO | 2 | 74 | 148.0 | |
| 4 | Second Electrode | ITO | 1.84 | 50 | 92.0 | |
| 5 | Hole Injecting Layer | CuPc | 1.72 | 9 | 15.5 | |
| 6 | Hole Transporting Layer | NPB | 1.72 | 30 | 51.6 | ←7a |
| 7 | Light Emitting Layer | Alq+ Rubrene+ DCM2 | 1.72 | 35 | 60.2 | |
| 9 | Electron Transporting Layer | Alq | 1.72 | 142 | 244.2 | |
| 10 | Electron Injecting Layer | $Li_2O$ | 1.39 | 6 | 8.3 | |
| 11 | Third Electrode | Ag | — | 10 | — | ←11a |
| 12 | Auxiliary Electrode | ITO | 1.84 | 168 | 309.1 | |

Similarly to Table 2, Table 4 shows below the lengths of optical paths in the present example. In the present example, a designed peak wavelength is 620 nm, and further, a light emitting region is located at a position inward by 2.9 nm of the optical thickness from the end face 7a of the light emitting layer.

TABLE 4

Example 2
Light Emitting Region: Inward by 2.9 nm from End Face 7a of Light Emitting Layer
Designed Peak wavelength: 620 nm

| | Length of the Optical Path (nm) | Length of the Optical Path/ Designed Peak Wavelength |
|---|---|---|
| From the End Face 2a of the 1st Electrode to the End Face 11a of the 3rd Electrode | 619.9 | 200/200 |
| From the End Face 2a of the 1st Electrode to the End Face 7a of the Light Emitting Layer | 307.1 | 99/200 |
| From the End Face 2a of the 1st Electrode to the Light Emitting Region | 310 | 100/200 |
| From the End Face 7a of the Light Emitting Layer to the End Face 11a of the 3rd Electrode | 312.8 | 101/200 |
| From the Light Emitting Region to the End Face 11a of the 3rd Electrode | 309.9 | 100/200 |
| Within the Auxiliary Electrode 12 | 309.1 | 100/200 |

As shown in Table 4, also in the present example, the length of each of the optical paths is substantially equal to a multiple of a natural number of a half of the designed peak wavelength, like in Example 1.

The first electrode and the second electrode in the light source in the present example were electrically short-circuited, and a current was supplied with the application of a DC voltage of 15 V between the second electrode and the third electrode. In the case of observation on the front axis of the light source parallel to the normal of a light emitting face, the emission of red light having a light emitting peak wavelength of 620 nm and a half-value breadth of a light emitting peak of 60 nm was observed. Even in the case where the voltage to be applied between the second electrode and the third electrode was varied, no variation of the light emitting peak wavelength was observed. In the case of the observation in a direction inclined by the angle θ from the normal of the light emitting face, the emission of yellow light having a light emitting peak wavelength of 585 nm and a half-value breadth of a light emitting peak of 50 nm was observed when the angle θ was 20°. Furthermore, the emission of very weak green light having a light emitting peak wavelength of about 540 nm was observed when the angle θ was 30°. Moreover, no light emission was observed at all when the angle θ was 35° or more.

Subsequently, while an AC voltage of 200 V was applied between the first electrode and the second electrode, the current was supplied with the application of a DC voltage of 14 V between the second electrode and the third electrode. In the case of the observation on the front axis of the light source parallel to the normal of the light emitting face, the shift of the light emitting peak wavelength to 611 nm was observed according to the application of the AC voltage. In the case of the observation in a direction inclined by the angle θ from the normal of the light emitting face, the emission of yellow light having a light emitting peak wavelength of 574 nm and a half-value breadth of a light emitting peak of 45 nm was observed when the angle θ was 20°. Furthermore, the emission of very weak green light having a light emitting peak wavelength of about 530 nm was observed when the angle θ was 30°. Moreover, no light emission was observed at all when the angle θ was 35° or more.

COMPARATIVE EXAMPLE 2

Neither the first electrode 2 and nor the piezoelectric thin film 3 in Example 2 were formed, and a second electrode 4 was formed directly on a substrate 1. On the second electrode 4, layers were formed in the same manner as in Example 2, thus fabricating a light source for comparison. Here, the constitution and thickness of each of the layers were the same as those in Example 2.

A current was supplied with the application of a DC voltage of 15 V between the second electrode and a third electrode in the light source. Then, the emission of slightly orangy red light having a light emitting peak wavelength of 645 nm and a half-value breadth of a light emitting peak of 100 nm was observed. The light emitting intensity was as low as less than 40% in comparison with that in Example 2. Even in the case where the voltage to be applied between the second electrode and the third electrode was varied, no variation of the light emitting peak wavelength was observed. In the case of the observation in a direction inclined by the angle θ from the normal of the light emitting face, no variation of the light emitting peak wavelength was observed when the angle θ ranged from 0° to 75°. Although it was difficult to measure a light emitting spectrum when the angle θ exceeded 75°, no variation of the emitted light color was observed even as viewed almost sideways.

EXAMPLE 3

Figure 3:
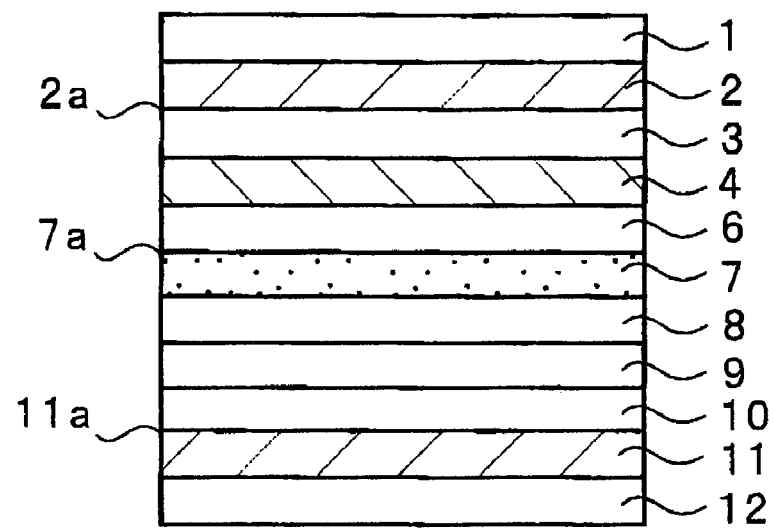
FIG. 3 is a schematic cross-sectional view showing a wavelength variable light source in a further preferred embodiment according to the present invention.

FIG. 3 is a schematic cross-sectional view showing a wavelength variable light source in a further preferred embodiment. A thin film (having a thickness of 50 nm) made of gold as a first electrode 2 was formed on a (110) surface of a sapphire substrate as a substrate 1 by sputtering method. Subsequently, on the first electrode 2, a thin film (having a thickness of 50 nm) made of zinc oxide (ZnO) was formed as a piezoelectric thin film 3 by the same reactive sputtering method as in Example 2. On the piezoelectric thin film 3, an ITO thin film (having a thickness of 48 nm) was formed as a second electrode 4 by sputtering method. Thereafter, a hole transporting layer 6 (having a thickness of 20 nm) made of NPB was formed.

On the hole transporting layer 6, a mixture light emitting layer (having a thickness of 30 nm) was formed as a light emitting layer 7 containing 94% by mass of 4,4'-bis(carbazol-9-yl)-biphenyl (CBP) expressed below by a chemical formula and 6.0% by mass of iridium(III)bis(4,6-difluorophenyl)-pyridinato-N,C2')picolinato (IrX) expressed by the following chemical formula.

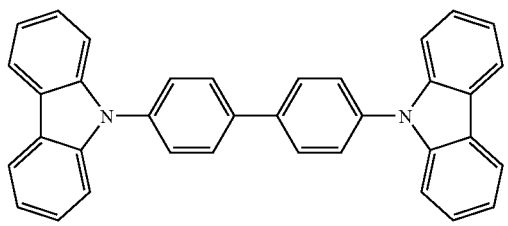

CBP

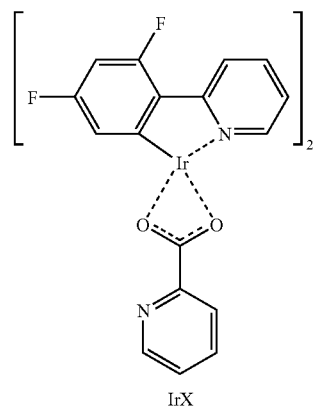

IrX

Subsequently, on the light emitting layer 7, a hole inhibitable electron transporting layer 8 (having a thickness of 10 nm) was formed, that is made of 2,9-dimethyl-4,7-diphenyl-1,10-phenanthroline (BCP) expressed by the following chemical formula.

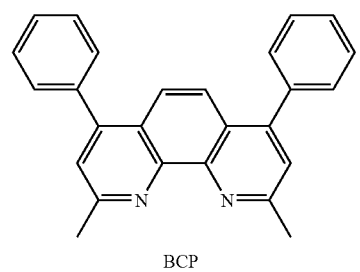

BCP

Thereafter, an electron transporting layer 9 (having a thickness of 85 nm) made of Alq was formed, and further, on the electron transporting layer 9 was formed an electron injecting layer 10 (having a thickness of 6 nm) made of $Li_2O$. Both of the above-described layers were formed by a vacuum evaporation method.

Subsequently, a third electrode 11 (having a thickness of 10 nm) made of Ag and an auxiliary electrode 12 (having a thickness of 117 nm) made of ITO were formed in sequence by sputtering method.

The simplified molecular formula of CBP is expressed by $C_{36}H_{24}N_2$, which has a mol mass of 484.60 g/mol. The simplified molecular formula of BCP is expressed by $C_{26}H_{20}N_2$, which has a mol mass of 360.45 g/mol. The simplified molecular formula of IrX is expressed by $C_{28}H_{16}N_3O_2Ir$, which has a mol mass of 502.44 g/mol.

Table 5 shows below the material, refractive index, actual thickness and optical thickness of each of the layers.

TABLE 5

| Ref. No. | Material | Refractive Index | Actual Thickness (nm) | Optical Thickness (nm) | |
|---|---|---|---|---|---|
| 1 | Substrate | Sapphire | | | |
| 2 | First Electrode | Au | — | 50 | — |
| 3 | Piezoelectric Thin Film | ZnO | 2 | 50 | 100.0 |
| 4 | Second Electrode | ITO | 2 | 48 | 96.0 |
| 6 | Hole Transporting Layer | NPB | 1.83 | 20 | 36.6 |
| 7 | Light Emitting Layer | CPB+ IrX | 1.83 | 30 | 54.9 |
| 8 | Hole Inhibitable Electron Transporting Layer | BCP | 1.83 | 10 | 18.3 |
| 9 | Electron Transporting Layer | Alq | 1.83 | 85 | 155.6 |
| 10 | Electron Injecting Layer | $Li_2O$ | 1.39 | 6 | 8.3 |
| 11 | Third Electrode | Ag | — | 10 | — |
| 12 | Auxiliary Electrode | ITO | 2 | 117 | 234.0 |

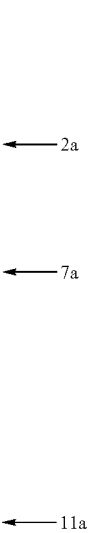

A designed peak wavelength of the wavelength variable light source in the present example is 470 nm. Furthermore, a light emitting region is located at a position inward by 2.3 nm of the optical thickness from the end face 7a of the light emitting layer.

Similarly to Table 2 in Example 1, Table 6 shows below the lengths of optical paths in the present example.

TABLE 6

Example 3
Light Emitting Region: Inward by 2.3 nm from End
Face 7a of Light Emitting Layer
Designed Peak wavelength: 470 nm

| | Length of the Optical Path (nm) | Length of the Optical Path/ Designed Peak Wavelength |
|---|---|---|
| From the End Face 2a of the 1st Electrode to the End Face 11a of the 3rd Electrode | 469.7 | 200/200 |
| From the End Face 2a of the 1st Electrode to the End Face 7a of the Light Emitting Layer | 232.6 | 99/200 |
| From the End Face 2a of the 1st Electrode to the Light Emitting Region | 234.9 | 100/200 |
| From the End Face 7a of the Light Emitting Layer to the End Face 11a of the 3rd Electrode | 237.1 | 101/200 |
| From the Light Emitting Region to the End Face 11a of the 3rd Electrode | 234.8 | 100/200 |
| Within the Auxiliary Electrode 12 | 234.0 | 100/200 |

As shown in Table 6, the length of each of the optical paths is substantially equal to a multiple of a natural number of a half of the designed peak wavelength.

The first electrode and the second electrode in the light source in the present example were electrically short-circuited, and a current was supplied with the application of a DC voltage of 12 V between the second electrode and the third electrode. In the case of observation on the front axis of the light source parallel to the normal of a light emitting face, the emission of blue light having a light emitting peak wavelength of 470 nm and a half-value breadth of a light emitting peak of 35 nm was observed. Even in the case where the voltage to be applied between the second electrode and the third electrode was varied, no variation of the light emitting peak wavelength was observed. In the case of the observation in a direction inclined by the angle θ from the normal of the light emitting face, the emission of blue light having a light emitting peak wavelength of 441 nm and a half-value breadth of a light emitting peak of 30 nm was observed when the angle θ was 20°. Furthermore, the emission of very weak blue light was observed when the angle θ was 30°, wherein it was difficult to measure a light emitting spectrum. Moreover, no light emission was observed at all when the angle θ was 35° or more.

Subsequently, while an AC voltage of 200 V was applied between the first electrode and the second electrode, the current was supplied with the application of a DC voltage of 14 V between the second electrode and the third electrode. In the case of the observation on the front axis of the light source parallel to the normal of the light emitting face, the shift of the light emitting peak wavelength to 465 nm was observed according to the application of the AC voltage. In the case of the observation in a direction inclined by the angle θ from the normal of the light emitting face, the emission of blue light having a light emitting peak wavelength of 437 nm and a half-value breadth of a light emitting peak of 20 nm was observed when the angle θ was 20°. Furthermore, no light emission was observed at all when the angle θ was 30° or more.

COMPARATIVE EXAMPLE 3

Neither the first electrode 2 and nor the piezoelectric thin film 3 in Example 3 were formed, and a second electrode 4 was formed directly on a substrate 1. On the second electrode 4, layers were formed in the same manner as in Example 3, thus fabricating a light source for comparison. The constitution and thickness of each of the layers were the same as those in Example 3.

A current was supplied with the application of a DC voltage of 12 V between the second electrode and a third electrode in the light source. In the case of the observation on the front axis of the light source parallel to the normal of a light emitting face, the emission of considerably cyanic blue light having a light emitting peak wavelength of 480 nm and a half-value breadth of a light emitting peak of 70 nm was observed. The light emitting intensity was as low as less than 40% in comparison with that in Example 3. Even in the case where the voltage to be applied between the second electrode and the third electrode was varied, no variation of the light emitting peak wavelength was observed. In the case of the observation in a direction inclined by the angle θ from the normal of the light emitting face, no variation of the light emitting peak wavelength was observed when the angle θ ranged from 0° to 75°. Although it was difficult to measure a light emitting spectrum when the angle θ exceeded 75°, no variation of the emitted light color was observed even as viewed almost sideways.

Figure 4:
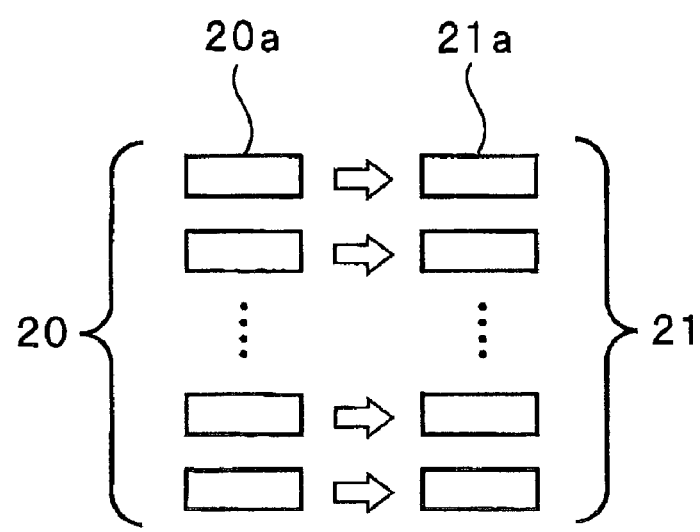
FIG. 4 is a schematic diagram illustrating a high-speed optical communication system by the use of the wavelength variable light source according to the present invention.

FIG. 4 is a schematic diagram illustrating a high-speed optical communication system by the use of the wavelength variable light source according to the present invention. As illustrated in FIG. 4, a plurality of wavelength variable light sources 20a is disposed, thereby configuring a transmitting device 20. Furthermore, a plurality of photodiodes 21a are disposed at positions corresponding to the wavelength variable light sources 20a, respectively, thereby configuring a receiving device 21. The wavelength of a light emitting spectrum to be emitted from the wavelength variable light source 20a can be varied by providing the refractive index modulating means in the wavelength variable light source 20a with variations in voltage corresponding to an electric signal. The photodiode 21a receives the variation of the light emitting spectrum, thereby converting an optical signal sent from the wavelength variable light source 20a into an electric signal.

The high-speed optical communication device illustrated in FIG. 4 is merely one example of communication devices using the wavelength variable light source according to the present invention. In other words, the wavelength variable light source according to the present invention is not limited to the device illustrated in FIG. 4.

EXAMPLE 4

A light source having a structure shown below in Table 7 was fabricated in the same process as in Example 1.

TABLE 7

| Ref. No. | | Material | Refractive Index | Actual Thickness (nm) | Optical Thickness (nm) | Total Length of the Optical Paths (nm) | Total Length of the Optical Paths (nm) | Length of the Optical Path Between a Main Reflectors (nm) |
|---|---|---|---|---|---|---|---|---|
| 1 | Substrate | Glass | | | | | | |
| 2 | First Electrode | Al | — | 200.0 | — | | | |
| 2a | End Face | | | | | | (2a) | (2a) |
| 3 | Refractive Index Modulating Means | AlN | 1.9 | 76.3 | 145.0 | | 432.3 | 580.0 |
| 4 | Second Electrode | ITO | 1.93 | 75.1 | 145.0 | 287.3 | | |
| 5 | Hole Injecting Layer | CuPc | 1.76 | 9.0 | 15.8 | | | |
| 6 | Hole Transporting Layer | NPB | 1.76 | 71.9 | 126.5 | | | |
| 7a | Interface | | | | | | (7a) | |
| 7 | Light Emitting Layer | Alq | 1.76 | 83.1 | 146.3 | | 147.7 | |
| 10 | Electron Injecting Layer | LiF | 1.39 | 1.0 | 1.4 | | | |
| 11a | Interface | | | | | | (11a) | (11a) |
| 11 | Third Electrode | Al | — | 10.0 | — | | | |
| 12 | Auxiliary Electrode | ITO | 1.93 | 150.3 | 290.0 | | 290.0 | |

A designed peak wavelength in the present example is 580 nm. Furthermore, a light emitting region is located at a position inward by 2.7 nm of the optical thickness from the end face 7a of the light emitting layer.

EXAMPLE 5

A light source having a structure shown below in Table 8 was fabricated in the same process as in Example 2.

TABLE 8

| Ref. No. | | Material | Refractive Index | Actual Thickness (nm) | Optical Thickness (nm) | Total Length of the Optical Paths (nm) | Total Length of the Optical Paths (nm) | Total Length of the Optical Paths (nm) |
|---|---|---|---|---|---|---|---|---|
| 1 | Substrate | Glass | | | | | | |
| 2 | First Electrode | Au | — | 200.0 | — | — | — | — |
| 2a | Interface | | | | | | (2a) | (2a) |
| 3 | Refractive Index Modulating Means | ZnO | 2 | 95.0 | 190.0 | | 362.9 | 720.2 |
| 4 | Second Electrode | ITO | 1.84 | 75.6 | 139.1 | 172.9 | | |
| 5 | Hole Injecting Layer | CuPc | 1.72 | 8.0 | 13.8 | | | |
| 6 | Hole Transporting Layer | NPB | 1.72 | 11.6 | 20.0 | | | |
| 7a | Interface | | | | | | (7a) | |
| 7 | Light Emitting Layer | Alq + Rubrene + DCM2 | 1.72 | 8.7 | 15.0 | 169.0 | 357.3 | |
| 9 | Electron Transporting Layer | Alq | 1.72 | 89.5 | 154.0 | | | |
| 10 | Electron Injecting Layer | $Li_2O$ | 1.39 | 6.0 | 8.3 | | | |
| 12 | Auxiliary Electrode | ITO | 1.84 | 97.8 | 180.0 | | | |
| 11a | Interface | | | | | | (11a) | (11a) |
| 11 | Third Electrode | Ag | — | 10.0 | — | — | — | — |

A designed peak wavelength in the present example is 720 nm. Furthermore, a light emitting region is located at a position inward by 2.9 nm of the optical thickness from the end face 7a of the light emitting layer.

EXAMPLE 6

Dielectric layers 21 to 24, which were different in refractive index from each other, were laminated on a glass substrate 1, thereby obtaining a dielectric multi-layer mirror. An ITO layer as an electrode 2 layer was formed by sputtering method.

Thereafter, a light source having a structure shown below in Table 9 was fabricated in the same process as in Example 5.

TABLE 9

| Ref. No. | | Material | Refractive Index | Actual Thickness (nm) | Optical Thickness (nm) | Total Length of the Optical Paths (nm) | Total Length of the Optical Paths (nm) | Total Length of the Optical Paths (nm) |
|---|---|---|---|---|---|---|---|---|
| 1 | Substrate | Glass | | | | | | |
| 24 | Low Refractive Index Layer | $SiO_2$ | 1.46 | 119.9 | 175.0 | | | |
| 23 | High Refractive Index Layer | $TiO_2$ | 2.35 | 74.5 | 175.0 | | | |
| 22 | Low Refractive Index Layer | $SiO_2$ | 1.46 | 119.9 | 175.0 | | | |
| 21 | High Refractive Index Layer | $TiO_2$ | 2.35 | 74.5 | 175.0 | | | |
| 2 | First Electrode | ITO | 1.84 | 97.8 | 180.0 | | | |
| 2a | Interface | | | | | | (2a) | (2a) |
| 3 | Refractive Index Modulating Means | ZnO | 2 | 95.0 | 190.0 | | 362.9 | 720.2 |
| 4 | Second Electrode | ITO | 1.84 | 75.6 | 139.1 | 172.9 | | |
| 5 | Hole Injecting Layer | CuPc | 1.72 | 8.0 | 13.8 | | | |
| 6 | Hole Transporting Layer | NPB | 1.72 | 11.6 | 20.0 | | | |
| 7a | Interface | | | | | | (7a) | |

TABLE 9-continued

| Ref. No. | | Material | Refractive Index | Actual Thickness (nm) | Optical Thickness (nm) | Total Length of the Optical Paths (nm) | Total Length of the Optical Paths (nm) | Total Length of the Optical Paths (nm) |
|---|---|---|---|---|---|---|---|---|
| 7 | Light Emitting Layer | Alq + Rubrene + DCM2 | 1.72 | 8.7 | 15.0 | 169.0 | 357.3 | |
| 9 | Electron Transporting Layer | Alq | 1.72 | 89.5 | 154.0 | | | |
| 10 | Electron Injecting Layer | $Li_2O$ | 1.39 | 6.0 | 8.3 | | | |
| 12 | Auxiliary Electrode | ITO | 1.84 | 97.8 | 180.0 | | | |
| 11a | Interface | | | | | | (11a) | (11a) |
| 11 | Third Electrode | Ag | — | 10.0 | — | — | — | — |

A designed peak wavelength in the present example is 720 nm. Furthermore, a light emitting region is located at a position inward by 2.9 nm of the optical thickness from the end face 7a of the light emitting layer.

EXAMPLE 7

A substrate 1 was made of quartz glass. An electrode 2b was formed by depositing a silver thin film in the vacuum by an electron beam heating method.

Subsequently, on the electrode 2b, a zinc oxide (ZnO) layer was formed as a piezoelectric thin film 3b by laser ablation method using a KrF excimer pulse laser having a wavelength of 248 nm. At that time, the partial pressure of oxygen was set within the range of $10^{-6}$ Pa to $10^{-7}$ Pa, and further, the temperature of the substrate was set to 600° C. The temperature of the substrate was able to be set variably within the range of 500° C. to 700° C. As a result of an analysis of the resultant zinc oxide (ZnO) layer by X-ray diffraction, it was confirmed that the c-axes of zinc oxide were aligned in a direction perpendicular to the surface of the substrate.

Subsequently, on the piezoelectric thin film 3b, an ITO layer was formed as an auxiliary electrode 2c by sputtering method.

Next, on the auxiliary electrode 2c, a silver thin film was formed as a first electrode 2 by sputtering method.

Thereafter, on the electrode 2, a zinc oxide layer was formed as a piezoelectric thin film 3 by the laser ablation method in the same manner as described above.

And then, on the piezoelectric thin film 3, an ITO layer was formed as an electrode 4 by sputtering method.

Thereafter, a light source having a structure shown below in Table 10 was fabricated in the same process as in Example 3. IrX for use in a light emitting layer 7 was replaced by an organic metal compound ReX containing rhenium therein, expressed by the following chemical formula.

TABLE 10

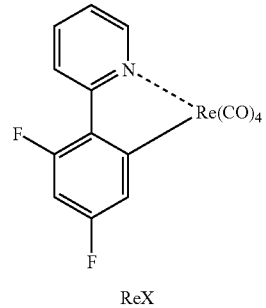

ReX

| Ref. No. | | Material | Refractive Index | Actual Thickness (nm) | Optical Thickness (nm) | Total Length of the Optical Paths (nm) | Total Length of the Optical Paths (nm) | Total Length of the Optical Paths (nm) |
|---|---|---|---|---|---|---|---|---|
| 1 | Substrate | Quartz Glass | | | | | | |
| 2b | Electrode 2b | Ag | — | 100.0 | — | — | — | — |
| 3b | Refractive Index Modulating Means | ZnO | 2 | 67.5 | 135.0 | | 265.0 | |
| 2c | Auxiliary Electrode | ITO | 2 | 65.0 | 130.0 | | | |
| 2 | First Electrode | Ag | — | 10.0 | — | — | — | — |
| 2a | Interface | | | | | | (2a) | (2a) |
| 3 | Refractive Index Modulating Means | ZnO | 2 | 67.5 | 135.0 | | 263.0 | 530.0 |

TABLE 10-continued

ReX (structure: pyridine coordinated to Re(CO)4, with difluorophenyl group)

| Ref. No. | | Material | Refractive Index | Actual Thickness (nm) | Optical Thickness (nm) | Total Length of the Optical Paths (nm) | Total Length of the Optical Paths (nm) | Total Length of the Optical Paths (nm) |
|---|---|---|---|---|---|---|---|---|
| 4 | Second Electrode | ITO | 2 | 49.0 | 98.0 | 128.0 | | |
| 6 | Hole Transporting Layer | NPB | 1.83 | 16.4 | 30.0 | | | |
| 7a | Interface | | | | | | (7a) | |
| 7 | Light Emitting Layer | CBP + ReX | 1.83 | 60.3 | 110.4 | | 267.0 | |
| 8 | Hole Inhibitable Electron Transporting Layer | BCP | 1.83 | 10.0 | 18.3 | 156.6 | | |
| 9 | Electron Transporting Layer | Alq | 1.83 | 71.0 | 130.0 | | | |
| 10 | Electron Injecting Layer | Li$_2$O | 1.39 | 6.0 | 8.3 | | | |
| 11a | Interface | | | | | | (11a) | (11a) |
| 11 | Third Electrode | Ag | — | 10.0 | — | — | — | — |
| 12 | Auxiliary Electrode | ITO | 2 | 65.5 | 131.0 | | 131.0 | |

A designed peak wavelength of a wavelength variable light source in the present example is 530 nm. Furthermore, alight emitting region is located at a position inward by 2.0 nm of the optical thickness from the end face 7a of the light emitting layer.

(Light Emitting Characteristics)

Light emitting characteristics in each of the above-described examples and comparative examples are shown below in Tables 11 to 14.

TABLE 11

| | Control Voltage Vc/V | Control Voltage Vc | θ (°) | Light Emitting Peak Wavelength (nm) | Half-Value Breadth of Light Emitting Peak (nm) | Relative Luminance | Emitted Light Color |
|---|---|---|---|---|---|---|---|
| Ex. 1 | 0 | none | 0 | 525 | 40 | 1 | Green |
| Ex. 1 | 0 | none | 10 | 517 | 39 | 0.9 | Green |
| Ex. 1 | 0 | none | 20 | 493 | 30 | 0.6 | Green |
| Ex. 1 | 0 | none | 30 | 450 | Cannot be Measured | 0.1 | Blue-Green |
| Ex. 1 | 0 | none | 35 | Cannot be Measured | Cannot be Measured | 0.01 | Cannot be Measured |
| Ex. 1 | 200 | a.c. | 0 | 521 | 40 | 1 | Green |
| Ex. 1 | 200 | a.c. | 10 | 513 | 38 | 0.85 | Green |
| Ex. 1 | 200 | a.c. | 20 | 489 | 25 | 0.5 | Green |
| Ex. 1 | 200 | a.c. | 30 | 450 | Cannot be Measured | 0.1 | Blue-Green |
| Ex. 1 | 200 | a.c. | 35 | No Light Emission | No Light Emission | 0 | No Light Emission |
| Ex. 1 | 200 | d.c. | 0 | 515 | 35 | 0.95 | Green |
| Ex. 1 | 200 | d.c. | 10 | 507 | 34 | 0.8 | Green |
| Ex. 1 | 200 | d.c. | 20 | 484 | 20 | 0.3 | Green |

TABLE 11-continued

| | Control Voltage Vc/V | Control Voltage Vc | θ (°) | Light Emitting Peak Wavelength (nm) | Half-Value Breadth of Light Emitting Peak (nm) | Relative Luminance | Emitted Light Color |
|---|---|---|---|---|---|---|---|
| Ex. 1 | 200 | d.c. | 30 | Cannot be Measured | Cannot be Measured | 0.05 | Cannot be Measured |
| Ex. 1 | 200 | d.c. | 35 | No Light Emission | No Light Emission | 0 | No Light Emission |
| Comp. Ex. 1 | none | none | 0 | 533 | 80 | 1 | Green |
| Comp. Ex. 1 | none | none | 45 | 533 | 80 | 0.6 | Green |
| Comp. Ex. 1 | none | none | 75 | 533 | 80 | 0.2 | Green |
| Ex. 4 | 0 | none | 0 | 550 | 25 | 0.8 | Green |
| Ex. 4 | 0 | none | 10 | 540 | 30 | 0.9 | Green |
| Ex. 4 | 0 | none | 20 | 530 | 40 | 1 | Green |
| Ex. 4 | 0 | none | 30 | 520 | 40 | 1 | Green |
| Ex. 4 | 0 | none | 35 | 480 | 18 | 0.7 | Green |
| Ex. 4 | 0 | none | 40 | 460 | 15 | 0.5 | Blue-Green |
| Ex. 4 | 0 | none | 45 | 450 | Cannot be Measured | 0.1 | Blue-Green |
| Ex. 4 | 0 | none | 50 | No Light Emission | No Light Emission | 0 | No Light Emission |
| Ex. 4 | 100 | d.c. | 0 | 535 | 35 | 0.9 | Green |
| Ex. 4 | 100 | d.c. | 10 | 530 | 40 | 1 | Green |
| Ex. 4 | 100 | d.c. | 20 | 515 | 38 | 0.9 | Green |
| Ex. 4 | 100 | d.c. | 30 | 470 | 15 | 0.3 | Blue-Green |
| Ex. 4 | 100 | d.c. | 35 | 450 | Cannot be Measured | 0.1 | Blue-Green |
| Ex. 4 | 100 | d.c. | 40 | No Light Emission | No Light Emission | 0 | No Light Emission |
| Comp. Ex.4 | none | none | 0 | 533 | 80 | 1 | Green |
| Comp. Ex.4 | none | none | 45 | 533 | 80 | 0.6 | Green |
| Comp. Ex.4 | none | none | 75 | 533 | 80 | 0.2 | Green |

TABLE 12

| | Control Voltage Vc/V | Control Voltage Vc | θ (°) | Light Emitting Peak Wavelength (nm) | Half-Value Breadth of Light Emitting Peak (nm) | Relative Luminance | Emitted Light Color |
|---|---|---|---|---|---|---|---|
| Ex. 2 | 0 | none | 0 | 620 | 60 | 1 | Red |
| Ex. 2 | 0 | none | 10 | 611 | 55 | 0.8 | Red |
| Ex. 2 | 0 | none | 20 | 585 | 50 | 0.5 | Yellow |
| Ex. 2 | 0 | none | 30 | 540 | Cannot be Measured | 0.1 | Green |
| Ex. 2 | 0 | none | 35 | No Light Emission | No Light Emission | 0 | No Light Emission |
| Ex. 2 | 200 | a.c. | 0 | 611 | 60 | 1 | Yellow |
| Ex. 2 | 200 | a.c. | 10 | 602 | 50 | 0.7 | Yellow |
| Ex. 2 | 200 | a.c. | 20 | 574 | 45 | 0.2 | Yellow |
| Ex. 2 | 200 | a.c. | 30 | 530 | Cannot be Measured | 0.1 | Green |
| Ex. 2 | 200 | a.c. | 35 | No Light Emission | No Light Emission | 0 | No Light Emission |
| Ex. 2 | 100 | d.c. | 0 | 605 | 50 | 0.8 | Yellow |
| Ex. 2 | 100 | d.c. | 10 | 600 | 45 | 0.6 | Yellow |
| Ex. 2 | 100 | d.c. | 20 | 570 | Cannot be Measured | 0.1 | Yellow |
| Ex. 2 | 100 | d.c. | 30 | No Light Emission | No Light Emission | 0 | No Light Emission |
| Ex. 2 | 100 | d.c. | 35 | No Light Emission | No Light Emission | 0 | No Light Emission |
| Comp. Ex.2 | none | none | 0 | 645 | 100 | 1 | Red |
| Comp. Ex.2 | none | none | 45 | 645 | 100 | 0.6 | Red |
| Comp. Ex.2 | none | none | 75 | 645 | 100 | 0.2 | Red |
| Comp. Ex.5 | none | none | 0 | 645 | 100 | 1 | Red |
| Comp. Ex.5 | none | none | 45 | 645 | 100 | 0.6 | Red |
| Comp. Ex.5 | none | none | 75 | 645 | 100 | 0.2 | Red |

TABLE 13

| | Control Voltage Vc/V | Control Voltage Vc | θ (°) | Light Emitting Peak Wavelength (nm) | Half-Value Breadth of Light Emitting Peak (nm) | Relative Luminance | Emitted Light Color |
|---|---|---|---|---|---|---|---|
| Ex. 5 | 0 | none | 0 | 710 | 30 | 0.6 | Red |
| Ex. 5 | 0 | none | 10 | 700 | 40 | 0.7 | Red |
| Ex. 5 | 0 | none | 20 | 680 | 55 | 1 | Red |
| Ex. 5 | 0 | none | 30 | 640 | 60 | 1 | Red |
| Ex. 5 | 0 | none | 35 | 620 | 50 | 0.6 | Red |
| Ex. 5 | 0 | none | 40 | 600 | 30 | 0.2 | Red |
| Ex. 5 | 0 | none | 45 | Cannot be Measured | Cannot be Measured | 0.05 | Red |
| Ex. 5 | 0 | none | 50 | No Light Emission | No Light Emission | 0 | No Light Emission |
| Ex. 5 | 100 | d.c. | 0 | 680 | 60 | 1 | Red |
| Ex. 5 | 100 | d.c. | 10 | 680 | 60 | 1 | Red |
| Ex. 5 | 100 | d.c. | 20 | 650 | 60 | 0.7 | Red |
| Ex. 5 | 100 | d.c. | 30 | 600 | 40 | 0.2 | Red |
| Ex. 5 | 100 | d.c. | 35 | 580 | Cannot be Measured | 0.1 | Red |
| Ex. 5 | 100 | d.c. | 40 | No Light Emission | No Light Emission | 0 | No Light Emission |
| Ex. 6 | 0 | none | 0 | 710 | 30 | 0.5 | Red |
| Ex. 6 | 0 | none | 10 | 700 | 35 | 0.6 | Red |
| Ex. 6 | 0 | none | 20 | 680 | 50 | 1 | Red |
| Ex. 6 | 0 | none | 30 | 640 | 50 | 0.9 | Red |
| Ex. 6 | 0 | none | 35 | 620 | 50 | 0.5 | Red |
| Ex. 6 | 0 | none | 40 | 600 | 30 | 0.1 | Red |
| Ex. 6 | 0 | none | 45 | Cannot be Measured | Cannot be Measured | 0.05 | Red |
| Ex. 6 | 0 | none | 50 | No Light Emission | No Light Emission | 0 | No Light Emission |
| Ex. 6 | 100 | d.c. | 0 | 680 | 55 | 1 | Red |
| Ex. 6 | 100 | d.c. | 10 | 680 | 55 | 0.9 | Red |
| Ex. 6 | 100 | d.c. | 20 | 650 | 55 | 0.6 | Red |
| Ex. 6 | 100 | d.c. | 30 | 600 | 35 | 0.1 | Red |
| Ex. 6 | 100 | d.c. | 35 | Cannot be Measured | Cannot be Measured | 0.05 | Red |
| Ex. 6 | 100 | d.c. | 40 | No Light Emission | No Light Emission | 0 | No Light Emission |
| Comp. Ex.6 | none | none | 0 | 645 | 100 | 1 | Red |
| Comp. Ex.6 | none | none | 45 | 645 | 100 | 0.6 | Red |
| Comp. Ex.6 | none | none | 75 | 645 | 100 | 0.2 | Red |

TABLE 14

| | Control Voltage Vc/V | Control Voltage Vc | θ (°) | Light Emitting Peak Wavelength (nm) | Half-Value Breadth of Light Emitting Peak (nm) | Relative Luminance | Emitted Light Color |
|---|---|---|---|---|---|---|---|
| Ex. 3 | 0 | none | 0 | 470 | 35 | 1 | Blue |
| Ex. 3 | 0 | none | 10 | 465 | 35 | 0.8 | Blue |
| Ex. 3 | 0 | none | 20 | 441 | 30 | 0.5 | Blue |
| Ex. 3 | 0 | none | 30 | Cannot be Measured | Cannot be Measured | 0.1 | Blue |
| Ex. 3 | 0 | none | 35 | No Light Emission | No Light Emission | 0 | No Light Emission |
| Ex. 3 | 200 | a.c. | 0 | 465 | 35 | 1 | Blue |
| Ex. 3 | 200 | a.c. | 10 | 460 | 35 | 0.7 | Blue |
| Ex. 3 | 200 | a.c. | 20 | 437 | 20 | 0.3 | Blue |
| Ex. 3 | 200 | a.c. | 30 | No Light Emission | No Light Emission | 0 | No Light Emission |
| Ex. 3 | 200 | a.c. | 35 | No Light Emission | No Light Emission | 0 | No Light Emission |
| Ex. 3 | 100 | d.c. | 0 | 450 | 30 | 0.8 | Blue |
| Ex. 3 | 100 | d.c. | 10 | 445 | 25 | 0.5 | Blue |
| Ex. 3 | 100 | d.c. | 20 | 435 | 20 | 0.1 | Blue |
| Ex. 3 | 100 | d.c. | 30 | No Light Emission | No Light Emission | 0 | No Light Emission |
| Ex. 3 | 100 | d.c. | 35 | No Light Emission | No Light Emission | 0 | No Light Emission |
| Comp. Ex. 3 | none | none | 0 | 480 | 70 | 1 | Blue |

TABLE 14-continued

|  | Control Voltage Vc/V | Control Voltage Vc | θ (°) | Light Emitting Peak Wavelength (nm) | Half-Value Breadth of Light Emitting Peak (nm) | Relative Luminance | Emitted Light Color |
|---|---|---|---|---|---|---|---|
| Comp. Ex. 3 | none | none | 75 | 480 | 70 | 0.2 | Blue |
| Comp. Ex. 7 | none | none | 0 | 460 | 50 | 1 | Blue |
| Comp. Ex. 7 | none | none | 75 | 460 | 50 | 0.2 | Blue |
| Ex. 7 | 0 | none | 0 | 500 | 50 | 0.8 | Blue |
| Ex. 7 | 0 | none | 10 | 480 | 40 | 0.9 | Blue |
| Ex. 7 | 0 | none | 20 | 460 | 30 | 1 | Blue |
| Ex. 7 | 0 | none | 30 | 460 | 30 | 1 | Blue |
| Ex. 7 | 0 | none | 35 | 440 | 25 | 0.8 | Blue |
| Ex. 7 | 0 | none | 40 | 420 | 20 | 0.4 | Blue |
| Ex. 7 | 0 | none | 45 | 400 | Cannot be Measured | 0.1 | Blue |
| Ex. 7 | 0 | none | 50 | No Light Emission | No Light Emission | 0 | No Light Emission |
| Ex. 7 | 100 | d.c. | 0 | 460 | 35 | 1 | Blue |
| Ex. 7 | 100 | d.c. | 10 | 460 | 30 | 1 | Blue |
| Ex. 7 | 100 | d.c. | 20 | 445 | 25 | 0.9 | Blue |
| Ex. 7 | 100 | d.c. | 30 | 400 | Cannot be Measured | 0.1 | Blue |
| Ex. 7 | 100 | d.c. | 35 | No Light Emission | No Light Emission | 0 | No Light Emission |
| Ex. 7 | 100 | d.c. | 40 | No Light Emission | No Light Emission | 0 | No Light Emission |

As described above, according to the present invention, it is possible to reduce the light emitting spectrum width and readily vary the light emitting wavelength in the light source for allowing the organic substance in the organic EL element to emit the light. Thus, the wavelength variable light source according to the present invention can be used in the high-speed optical communications or the like.

What is claimed is:

1. A wavelength variable light source comprising:
   a light emitting layer containing therein light emitting substance having a carbon-carbon inter-atomic bond;
   a pair of electrodes, one electrode of the pair of electrodes is disposed on each side of the light emitting layer so as to hold the light emitting layer therebetween;
   a pair of main reflectors disposed on both sides of the light emitting layer so as to hold the light emitting layer therebetween, thereby to constitute an optical resonator with respect to light emitted from the light emitting layer; and
   refractive index modulating means disposed on the optical path of the optical resonator, the refractive index modulating means being capable of reversibly varying the length of the optical path of the optical resonator so as to control the wavelength of the light emitted from the light source,
   wherein an auxiliary electrode having light transmittance is disposed outside of at least either one of the pair of electrodes holding the light emitting layer therebetween.

2. A wavelength variable light source as recited in claim 1, wherein the refractive index modulating means consists of a piezoelectric member held between the pair of electrodes.

3. A wavelength variable light source as recited in claim 2, wherein either one of the pair of electrodes holding the piezoelectric member therebetween is constituted of either one of the pair of electrodes holding the light emitting layer therebetween.

4. A wavelength variable light source as recited in claim 1, wherein the pair of main reflectors are constituted of the pair of electrodes holding the light emitting layer therebetween.

5. A wavelength variable light source as recited in claim 1, wherein the light emitting layer is an organic EL light emitting layer.

6. The wavelength variable light source as recited in claim 1, wherein each of the pair of main reflectors is composed of a metallic thin film.

7. A wavelength variable light source comprising:
   a light emitting layer containing therein light emitting substance having a carbon-carbon inter-atomic bond;
   a pair of electrodes, one electrode of the pair of electrodes is disposed on each side of the light emitting layer so as to hold the light emitting layer therebetween;
   a pair of main reflectors disposed on both sides of the light emitting layer so as to hold the light emitting layer therebetween, thereby to constitute an optical resonator with respect to light emitted from the light emitting layer; and
   refractive index modulating means disposed on the optical path of the optical resonator, the refractive index modulating means being capable of reversibly varying the length of the optical path of the optical resonator so as to control the wavelength of the light emitted from the light source,
   wherein the length of the optical path between the pair of main reflectors is substantially equal to a multiple of a natural number of a half of a predetermined peak wavelength of the light emitted from the light source.

8. A wavelength variable light source comprising:
   a light emitting layer containing therein light emitting substance having a carbon-carbon inter-atomic bond;
   a pair of electrodes, one electrode of the pair of electrodes is disposed on each side of the light emitting layer so as to hold the light emitting layer therebetween;
   a pair of main reflectors disposed on both sides of the light emitting layer so as to hold the light emitting layer therebetween, thereby to constitute an optical resonator with respect to light emitted from the light emitting layer; and refractive index modulating means disposed on the optical path of the optical resonator, the refractive index modulating means being capable of reversibly varying the length of the optical path of the optical resonator so as to control the wavelength of the light emitted from the light source, wherein the length of the optical path between the pair of main reflectors ranges from 99/200 to 101/200 of a multiple of a natural number of a predetermined peak wavelength of the light emitted from the light source.

9. A wavelength variable light source comprising:

a light emitting layer containing therein light emitting substance having a carbon-carbon inter-atomic bond;

a pair of electrodes, one electrode of the pair of electrodes is disposed on each side of the light emitting layer so as to hold the light emitting layer therebetween;

a pair of main reflectors disposed on both sides of the light emitting layer so as to hold the light emitting layer therebetween, thereby to constitute an optical resonator with respect to light emitted from the light emitting layer; and refractive index modulating means disposed on the optical path of the optical resonator, the refractive index modulating means being capable of reversibly varying the length of the optical path of the optical resonator so as to control the wavelength of the light emitted from the light source, wherein the length of the optical path from the center of a region in the light emitting layer, in which the light emission occurs most strongly, to the main reflector is substantially equal to a multiple of a natural number of a half of a predetermined peak wavelength of the light emitted from the light source.

10. A wavelength variable light source comprising:

a light emitting layer containing therein light emitting substance having a carbon-carbon inter-atomic bond;

a pair of electrodes, one electrode of the pair of electrodes is disposed on each side of the light emitting layer so as to hold the light emitting layer therebetween;

a pair of main reflectors disposed on both sides of the light emitting layer so as to hold the light emitting layer therebetween, thereby to constitute an optical resonator with respect to light emitted from the light emitting layer; and refractive index modulating means disposed on the optical path of the optical resonator, the refractive index modulating means being capable of reversibly varying the length of the optical path of the optical resonator so as to control the wavelength of the light emitted from the light source, wherein the length of the optical path from the center of a region in the light emitting layer, in which the light emission occurs most strongly, to the main reflector ranges from 99/200 to 101/200 of a multiple of a natural number of a predetermined peak wavelength of the light emitted from the light source.

11. A wavelength variable light source comprising:

a light emitting layer containing therein light emitting substance having a carbon-carbon inter-atomic bond;

a pair of electrodes, one electrode of the pair of electrodes is disposed on each side of the light emitting layer so as to hold the light emitting layer therebetween;

a pair of main reflectors disposed on both sides of the light emitting layer so as to hold the light emitting layer therebetween, thereby to constitute an optical resonator with respect to light emitted from the light emitting layer; and refractive index modulating means disposed on the optical path of the optical resonator, the refractive index modulating means being capable of reversibly varying the length of the optical path of the optical resonator so as to control the wavelength of the light emitted from the light source, wherein the length of the optical path from an end face nearer a region in the light emitting layer, in which the light emission occurs most strongly, to the main reflector nearer the end face is substantially equal to or slightly smaller than a multiple of a natural number of a half of a predetermined peak wavelength of the light emitted from the light source.

12. A wavelength variable light source comprising:

a light emitting layer containing therein light emitting substance having a carbon-carbon inter-atomic bond;

a pair of electrodes, one electrode of the pair of electrodes is disposed on each side of the light emitting layer so as to hold the light emitting layer therebetween;

a pair of main reflectors disposed on both sides of the light emitting layer so as to hold the light emitting layer therebetween, thereby to constitute an optical resonator with respect to light emitted from the light emitting layer; and refractive index modulating means disposed on the optical path of the optical resonator, the refractive index modulating means being capable of reversibly varying the length of the optical path of the optical resonator so as to control the wavelength of the light emitted from the light source, wherein the length of the optical path from an end face nearer a region in the light emitting layer, in which the light emission occurs most strongly, to the main reflector nearer the end face ranges from 101/200 to 88/200 of a multiple of a natural number of a predetermined peak wavelength of the light emitted from the light source.

13. A wavelength variable light source comprising:

a light emitting layer containing therein light emitting substance having a carbon-carbon inter-atomic bond;

a pair of electrodes, one electrode of the pair of electrodes is disposed on each side of the light emitting layer so as to hold the light emitting layer therebetween;

a pair of main reflectors disposed on both sides of the light emitting layer so as to hold the light emitting layer therebetween, thereby to constitute an optical resonator with respect to light emitted from the light emitting layer; and refractive index modulating means disposed on the optical path of the optical resonator, the refractive index modulating means being capable of reversibly varying the length of the optical path of the optical resonator so as to control the wavelength of the light emitted from the light source, wherein the length of the optical path from an end face nearer a region in the light emitting layer, in which the light emission occurs most strongly, to the main reflector more remote from the end face is substantially equal to or slightly greater than a multiple of a natural number of a half of a predetermined peak wavelength of the light emitted from the light source.

14. A wavelength variable light source comprising:

a light emitting layer containing therein light emitting substance having a carbon-carbon inter-atomic bond;

a pair of electrodes, one electrode of the pair of electrodes is disposed on each side of the light emitting layer so as to hold the light emitting layer therebetween;

a pair of main reflectors disposed on both sides of the light emitting layer so as to hold the light emitting layer therebetween, thereby to constitute an optical resonator with respect to light emitted from the light emitting layer; and refractive index modulating means disposed on the optical path of the optical resonator, the refractive index modulating means being capable of reversibly varying the length of the optical path of the optical resonator so as to control the wavelength of the light emitted from the light source, wherein the length of the optical path from an end face nearer a region in the light emitting layer, in which the light emission occurs most strongly, to the main reflector more remote from the end face ranges from 99/200 to 112/200 of a multiple of a natural number of a predetermined peak wavelength of the light emitted from the light source.

15. A wavelength variable light source comprising:

a light emitting layer containing therein light emitting substance having a carbon-carbon inter-atomic bond;

a pair of electrodes, one electrode of the pair of electrodes is disposed on each side of the light emitting layer so as to hold the light emitting layer therebetween;

a pair of main reflectors disposed on both sides of the light emitting layer so as to hold the light emitting layer therebetween, thereby to constitute an optical resonator with respect to light emitted from the light emitting layer; and refractive index modulating means disposed on the optical path of the optical resonator, the refractive index modulating means being capable of reversibly varying the length of the optical path of the optical resonator so as to control the wavelength of the light emitted from the light source, wherein an auxiliary electrode having light transmittance is disposed outside of at least either one of the pair of electrodes holding the light emitting layer therebetween, and wherein the length of the optical path of the auxiliary electrode is substantially equal to a multiple of a natural number of a half of a predetermined peak wavelength of the light emitted from the light source.

16. A wavelength variable light source comprising:

a light emitting layer containing therein light emitting substance having a carbon-carbon inter-atomic bond;

a pair of electrodes, one electrode of the pair of electrodes is disposed on each side of the light emitting layer so as to hold the light emitting layer therebetween;

a pair of main reflectors disposed on both sides of the light emitting layer so as to hold the light emitting layer therebetween, thereby to constitute an optical resonator with respect to light emitted from the light emitting layer; and refractive index modulating means disposed on the optical path of the optical resonator, the refractive index modulating means being capable of reversibly varying the length of the optical path of the optical resonator so as to control the wavelength of the light emitted from the light source, wherein an auxiliary electrode having light transmittance is disposed outside of at least either one of the pair of electrodes holding the light emitting layer therebetween, and wherein the length of the optical path of the auxiliary electrode ranges from 99/200 to 101/200 of a multiple of a natural number of a predetermined peak wavelength of the light emitted from the light source.

17. A wavelength variable light source comprising:

a light emitting layer containing therein light emitting substance having a carbon-carbon inter-atomic bond;

a pair of electrodes, one of the pair of electrodes is disposed on each side of the light emitting layer so as to hold the light emitting layer therebetween;

a pair of main reflectors disposed on both sides of the light emitting layer so as to hold the light emitting layer therebetween, thereby to constitute an optical resonator with respect to light emitted from the light emitting layer; and refractive index modulating means disposed on the optical path of the optical resonator, the refractive index modulating means being capable of reversibly varying the length of the optical path of the optical resonator so as to control the directivity of the light emitted from the light source, wherein an auxiliary electrode having light transmittance is disposed outside of at least either one of the pair of electrodes holding the light emitting layer therebetween.

18. A wavelength variable light source as recited in claim 17, wherein the refractive index modulating means consists of a piezoelectric member held between the pair of electrodes.

19. A wavelength variable light source as recited in claim 18, wherein either one of the pair of electrodes holding the piezoelectric member therebetween is constituted of either one of the pair of electrodes holding the light emitting layer therebetween.

20. A wavelength variable light source as recited in claim 17, wherein the pair of main reflectors are constituted of the pair of electrodes holding the light emitting layer therebetween.

21. A wavelength variable light source as recited in claim 17, wherein the light emitting layer is an organic EL light emitting layer.

22. A wavelength variable light source as recited in claim 17, wherein each of the pair of main reflectors is composed of a metallic thin film.

23. A wavelength variable light source comprising:

a light emitting layer containing therein light emitting substance having a carbon-carbon inter-atomic bond;

a pair of electrodes, one electrode of the pair of electrodes is disposed on each side of the light emitting layer so as to hold the light emitting layer therebetween;

a pair of main reflectors disposed on both sides of the light emitting layer so as to hold the light emitting layer therebetween, thereby to constitute an optical resonator with respect to light emitted from the light emitting layer; and refractive index modulating means disposed on the optical path of the optical resonator, the refractive index modulating means being capable of reversibly varying the length of the optical path of the optical resonator so as to control the directivity of the light emitted from the light source, wherein the length of the optical path between the pair of main reflectors is substantially equal to a multiple of a natural number of a half of a predetermined peak wavelength of the light emitted from the light source.

24. A wavelength variable light source comprising:
a light emitting layer containing therein light emitting substance having a carbon-carbon inter-atomic bond;
a pair of electrodes, one electrode of the pair of electrodes is disposed on each side of the light emitting layer so as to hold the light emitting layer therebetween;
a pair of main reflectors disposed on both sides of the light emitting layer so as to hold the light emitting layer therebetween, thereby to constitute an optical resonator with respect to light emitted from the light emitting layer; and
refractive index modulating means disposed on the optical path of the optical resonator, the refractive index modulating means being capable of reversibly varying the length of the optical path of the optical resonator so as to control the directivity of the light emitted from the light source,
wherein the length of the optical path between the pair of main reflectors ranges from 99/200 to 101/200 of a multiple of a natural number of a predetermined peak wavelength of the light emitted from the light source.

25. A wavelength variable light source comprising:
a light emitting layer containing therein light emitting substance having a carbon-carbon inter-atomic bond;
a pair of electrodes, one electrode of the pair of electrodes is disposed on each side of the light emitting layer so as to hold the light emitting layer therebetween;
a pair of main reflectors disposed on both sides of the light emitting layer so as to hold the light emitting layer therebetween, thereby to constitute an optical resonator with respect to light emitted from the light emitting layer; and
refractive index modulating means disposed on the optical path of the optical resonator, the refractive index modulating means being capable of reversibly varying the length of the optical path of the optical resonator so as to control the directivity of the light emitted from the light source,
wherein the length of the optical path from the center of a region in the light emitting layer, in which the light emission occurs most strongly, to the main reflector is substantially equal to a multiple of a natural number of a half of a predetermined peak wavelength of the light emitted from the light source.

26. A wavelength variable light source comprising:
a light emitting layer containing therein light emitting substance having a carbon-carbon inter-atomic bond;
a pair of electrodes, one electrode of the pair of electrodes is disposed on each side of the light emitting layer so as to hold the light emitting layer therebetween;
a pair of main reflectors disposed on both sides of the light emitting layer so as to hold the light emitting layer therebetween, thereby to constitute an optical resonator with respect to light emitted from the light emitting layer; and
refractive index modulating means disposed on the optical path of the optical resonator, the refractive index modulating means being capable of reversibly varying the length of the optical path of the optical resonator so as to control the directivity of the light emitted from the light source,
wherein the length of the optical path from the center of a region in the light emitting layer, in which the light emission occurs most strongly, to the main reflector ranges from 99/200 to 101/200 of a multiple of a natural number of a predetermined peak wavelength of the light emitted from the light source.

27. A wavelength variable light source comprising:
a light emitting layer containing therein light emitting substance having a carbon-carbon inter-atomic bond;
a pair of electrodes, one electrode of the pair of electrodes is disposed on each side of the light emitting layer so as to hold the light emitting layer therebetween;
a pair of main reflectors disposed on both sides of the light emitting layer so as to hold the light emitting layer therebetween, thereby to constitute an optical resonator with respect to light emitted from the light emitting layer; and
refractive index modulating means disposed on the optical path of the optical resonator, the refractive index modulating means being capable of reversibly varying the length of the optical path of the optical resonator so as to control the directivity of the light emitted from the light source,
wherein the length of the optical path from an end face nearer a region in the light emitting layer, in which the light emission occurs most strongly, to the main reflector nearer the end face is substantially equal to or slightly smaller than a multiple of a natural number of a half of a predetermined peak wavelength of the light emitted from the light source.

28. A wavelength variable light source comprising:
a light emitting layer containing therein light emitting substance having a carbon-carbon inter-atomic bond;
a pair of electrodes, one electrode of the pair of electrodes is disposed on each side of the light emitting layer so as to hold the light emitting layer therebetween;
a pair of main reflectors disposed on both sides of the light emitting layer so as to hold the light emitting layer therebetween, thereby to constitute an optical resonator with respect to light emitted from the light emitting layer; and
refractive index modulating means disposed on the optical path of the optical resonator, the refractive index modulating means being capable of reversibly varying the length of the optical path of the optical resonator so as to control the directivity of the light emitted from the light source,
wherein the length of the optical path from an end face nearer a region in the light emitting layer, in which the light emission occurs most strongly, to the main reflector nearer the end face ranges from 101/200 to 88/200 of a multiple of a natural number of a predetermined peak wavelength of the light emitted from the light source.

29. A wavelength variable light source comprising:
a light emitting layer containing therein light emitting substance having a carbon-carbon inter-atomic bond;
a pair of electrodes, one electrode of the pair of electrodes is disposed on each side of the light emitting layer so as to hold the light emitting layer therebetween;
a pair of main reflectors disposed on both sides of the light emitting layer so as to hold the light emitting layer therebetween, thereby to constitute an optical resonator with respect to light emitted from the light emitting layer; and
refractive index modulating means disposed on the optical path of the optical resonator, the refractive index modulating means being capable of reversibly varying the length of the optical path of the optical resonator so as to control the directivity of the light emitted from the light source,
wherein the length of the optical path from an end face nearer a region in the light emitting layer, in which the light emission occurs most strongly, to the main reflector more remote from the end face is substantially equal to or slightly greater than a multiple of a natural number of a half of a predetermined peak wavelength of the light emitted from the light source.

30. A wavelength variable light source comprising:
a light emitting layer containing therein light emitting substance having a carbon-carbon inter-atomic bond;
a pair of electrodes, one electrode of the pair of electrodes is disposed on each side of the light emitting layer so as to hold the light emitting layer therebetween;
a pair of main reflectors disposed on both sides of the light emitting layer so as to hold the light emitting layer therebetween, thereby to constitute an optical resonator with respect to light emitted from the light emitting layer; and
refractive index modulating means disposed on the optical path of the optical resonator, the refractive index modulating means being capable of reversibly varying the length of the optical path of the optical resonator so as to control the directivity of the light emitted from the light source,
wherein the length of the optical path from an end face nearer a region in the light emitting layer, in which the light emission occurs most strongly, to the main reflector more remote from the end face ranges from 99/200 to 112/200 of a multiple of a natural number of a predetermined peak wavelength of the light emitted from the light source.

31. A wavelength variable light source comprising:
a light emitting layer containing therein light emitting substance having a carbon-carbon inter-atomic bond;
a pair of electrodes, one electrode of the pair of electrodes is disposed on each side of the light emitting layer so as to hold the light emitting layer therebetween;
a pair of main reflectors disposed on both sides of the light emitting layer so as to hold the light emitting layer therebetween, thereby to constitute an optical resonator with respect to light emitted from the light emitting layer; and
refractive index modulating means disposed on the optical path of the optical resonator, the refractive index modulating means being capable of reversibly varying the length of the optical path of the optical resonator so as to control the directivity of the light emitted from the light source,
wherein an auxiliary electrode having light transmittance is disposed outside of at least either one of the pair of electrodes holding the light emitting layer therebetween, and
wherein the length of the optical path of the auxiliary electrode is substantially equal to a multiple of a natural number of a half of a predetermined peak wavelength of the light emitted from the light source.

32. A wavelength variable light source comprising:
a light emitting layer containing therein light emitting substance having a carbon-carbon inter-atomic bond;
a pair of electrodes, one electrode of the pair of electrodes is disposed on each side of the light emitting layer so as to hold the light emitting layer therebetween;
a pair of main reflectors disposed on both sides of the light emitting layer so as to hold the light emitting layer therebetween, thereby to constitute an optical resonator with respect to light emitted from the light emitting layer; and
refractive index modulating means disposed on the optical path of the optical resonator, the refractive index modulating means being capable of reversibly varying the length of the optical path of the optical resonator so as to control the directivity of the light emitted from the light source,
wherein an auxiliary electrode having light transmittance is disposed outside of at least either one of the pair of electrodes holding the light emitting layer therebetween, and
wherein the length of the optical path of the auxiliary electrode ranges from 99/200 to 101/200 of a multiple of a natural number of a predetermined peak wavelength of the light emitted from the light source.

* * * * *